US012562215B2

(12) United States Patent
Sharma et al.

(10) Patent No.: US 12,562,215 B2
(45) Date of Patent: Feb. 24, 2026

(54) PROVIDING ORTHOGONAL SUBARRAYS IN A DYNAMIC RANDOM ACCESS MEMORY

(71) Applicant: Intel Corporation, Santa Clara, CA (US)

(72) Inventors: Abhishek Anil Sharma, Portland, OR (US); Sagar Suthram, Portland, OR (US); Rajabali Koduri, Saratoga, CA (US); Pushkar Ranade, San Jose, CA (US); Wilfred Gomes, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 820 days.

(21) Appl. No.: 17/708,448

(22) Filed: Mar. 30, 2022

(65) Prior Publication Data

US 2023/0317140 A1 Oct. 5, 2023

(51) Int. Cl.
*G11C 11/408* (2006.01)
*G11C 11/4094* (2006.01)
*H03K 19/0185* (2006.01)
*H03K 19/17728* (2020.01)

(52) U.S. Cl.
CPC ...... *G11C 11/4087* (2013.01); *G11C 11/4085* (2013.01); *G11C 11/4094* (2013.01); *H03K 19/018521* (2013.01); *H03K 19/17728* (2013.01)

(58) Field of Classification Search
CPC ............ G11C 11/4087; G11C 11/4085; G11C 11/4094; G11C 5/025; G11C 7/1006; G11C 8/14; G11C 11/4093; G11C 11/4096; G11C 11/4097; G11C 11/54; H03K 19/018521; H03K 19/17728
USPC ............................................... 365/51, 230.06
See application file for complete search history.

(56) References Cited

U.S. PATENT DOCUMENTS

| | | | | |
|---|---|---|---|---|
| 6,021,074 A | * | 2/2000 | Blish, II | ......... G01R 31/318516 |
| | | | | 365/201 |
| 6,111,801 A | * | 8/2000 | Brady | .................... G11C 29/02 |
| | | | | 365/201 |
| 7,746,107 B1 | * | 6/2010 | Singh | ............... H03K 19/17764 |
| | | | | 326/38 |
| 11,538,522 B1 | * | 12/2022 | Mirichigni | ........... G11C 13/004 |
| 2004/0026716 A1 | * | 2/2004 | Ishimatsu | ............. H01L 23/528 |
| | | | | 257/E23.151 |
| 2010/0232240 A1 | * | 9/2010 | Norman | .................... G11C 5/02 |
| | | | | 365/63 |
| 2013/0223126 A1 | * | 8/2013 | Kwak | ................ G11C 13/0004 |
| | | | | 365/148 |

(Continued)

OTHER PUBLICATIONS

João Dinis Ferreira, et al., pLUTo: Enabling Massively Parallel Computation In DRAM via Lookup Tables, arXiv:2104.07699v2 [cs.AR], Nov. 25, 2021, 14 pgs.

*Primary Examiner* — Michael T Tran
(74) *Attorney, Agent, or Firm* — Nicholson De Vos Webster & Elliott LLP

(57) ABSTRACT

In one embodiment, a memory comprises: a first subarray having a first plurality of memory cells, the first subarray having a first orientation; and a second subarray having a second plurality of memory cells, the second subarray having a second orientation, the second orientation orthogonal to the first orientation. Other embodiments are described and claimed.

20 Claims, 12 Drawing Sheets

(56) References Cited

U.S. PATENT DOCUMENTS

| | | | |
|---|---|---|---|
| 2015/0138863 A1* | 5/2015 | Roy | G11C 11/419 |
| | | | 365/72 |
| 2017/0154926 A1* | 6/2017 | Hsu | H10N 70/063 |
| 2017/0271405 A1* | 9/2017 | Toriyama | H10D 62/235 |
| 2019/0043923 A1* | 2/2019 | Ahmed | H10N 70/882 |
| 2020/0091239 A1* | 3/2020 | Miyazaki | H01L 23/528 |
| 2020/0388331 A1* | 12/2020 | Luo | G11C 13/0014 |
| 2020/0411759 A1* | 12/2020 | Sei | G11C 13/003 |
| 2021/0074695 A1 | 3/2021 | Gomes et al. | |
| 2021/0225808 A1 | 7/2021 | Bohr et al. | |
| 2021/0375849 A1 | 12/2021 | Gomes et al. | |
| 2022/0043957 A1* | 2/2022 | Biswas | H10D 89/10 |
| 2022/0149275 A1* | 5/2022 | Ok | H10N 70/826 |

* cited by examiner

500

501

700

PROVIDING ORTHOGONAL SUBARRAYS IN A DYNAMIC RANDOM ACCESS MEMORY

BACKGROUND

Memories such as dynamic random access memories (DRAMs) are often implemented with a bank structure, where each bank may include multiple subarrays. Typical read operations in a conventional DRAM require a pre-charge or charge sharing operation, which can consume power and increase latency of the read operations. Such power consumption can impact battery-operated devices, and read latencies can affect performance.

DETAILED DESCRIPTION

In various embodiments, an integrated circuit (IC) package may include multiple dies in stacked relation. More particularly in embodiments, at least one compute die may be adapted on a memory die in a manner to provide fine-grained memory access by way of localized dense connectivity between compute elements of the compute die and localized banks (or other local portions) of the memory die. Further, the memory die may be configured with different subarrays (e.g., neighboring subarrays) having orthogonal orientations. With this arrangement, a first subarray may be configured to store table information (such as a lookup table) having tag-based information such that it can be determined with low latency whether an address is present in another subarray having a different orientation. In this way, the power and latency expense of accessing the other subarray can be avoided if it is determined that an address of requested data is not present in this subarray.

In addition, orthogonal subarrays can be configured to store data, e.g., matrix data, that can be preferentially accessed to efficiently perform matrix operations, such as matrix multiplications using computation circuitry locally coupled to the subarrays. This close physical coupling of compute elements to corresponding local portions of the memory die enables the compute elements to locally access local memory portions, in contrast to a centralized memory access system that is conventionally implemented via a centralized memory controller.

Figure 1:
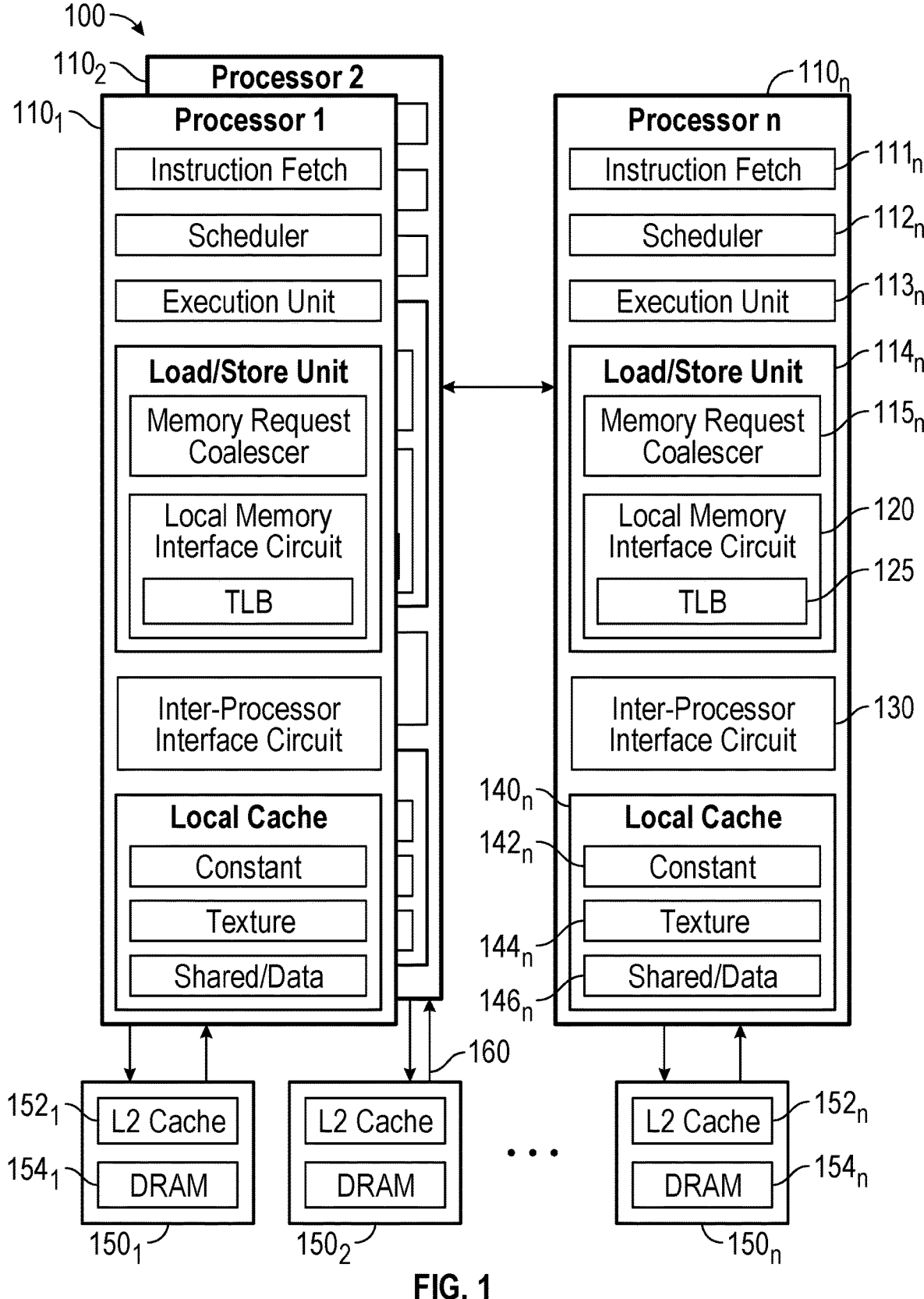
FIG. 1 is a block diagram of a package having memory tightly coupled with processing circuitry in accordance with an embodiment.

Referring now to FIG. 1, shown is a block diagram of a package having memory tightly coupled with processing circuitry in accordance with an embodiment. As shown in FIG. 1, package 100 includes a plurality of processors $110_1$-$110_n$. In the embodiment shown, processors 110 are implemented as streaming processors. However embodiments are not limited in this regard, and in other cases the processors may be implemented as general-purpose processing cores, accelerators such as specialized or fixed function units or so forth. As used herein, the term "core" refers generally to any type of processing circuitry that is configured to execute instructions, tasks and/or workloads, namely to process data.

In the embodiment of FIG. 1, processors 110 each individually couple directly to corresponding portions of a memory 150, namely memory portions $150_1$-$150_n$. As such, each processor 110 directly couples to a corresponding local portion of memory 150 without a centralized interconnection network therebetween. In one or more embodiments described herein, this direct coupling may be implemented by stacking multiple die within package 100. For example, processors 110 may be implemented on a first die and memory 150 may be implemented on at least one other die, where these dies may be stacked on top of each other, as will be described more fully below. By "direct coupling" it is meant that a processor (core) is physically in close relation to a local portion of memory in a non-centralized arrangement so that the processor (core) has access only to a given local memory portion and without communicating through a memory controller or other centralized controller.

As seen, each instantiation of processor 110 may directly couple to a corresponding portion of memory 150 via interconnects 160. Although different physical interconnect structures are possible, in many cases, interconnects 160 may be implemented by one or more of conductive pads, bumps or so forth. Each processor 110 may include TSVs that directly couple to TSVs of a corresponding local portion of memory 150. In such arrangements, interconnects 160 may be implemented as bumps or hybrid bonding or other bumpless technique.

Memory 150 may, in one or more embodiments, include a level 2 (L2) cache 152 and a dynamic random access memory (DRAM) 154. As illustrated, each portion of memory 150 may include one or more banks or other portions of DRAM 154 associated with a corresponding processor 110. In one embodiment, each DRAM portion 154 may have a width of at least 1024 words. Of course other widths are possible. Also while a memory hierarchy including both an L2 cache and DRAM is shown in FIG. 1, it is possible for an implementation to provide only DRAM 154 without the presence of an L2 cache (at least within memory 150). This is so, as DRAM 154 may be configured to operate as a cache, as it may provide both spatial and temporal locality for data to be used by its corresponding processor 110. This is particularly so when package 100 is included in a system having a system memory (e.g., implemented as dual-inline memory modules (DIMMs) or other volatile or non-volatile memory). In other cases, such as a DRAM-less system, there may be multiple memory dies, including at least one die having local memory portions in accordance with an embodiment, and possibly one or more other memory die having conventional DRAM to act as at least a portion of a system memory. As an example, one memory die may be configured as a cache memory and another memory die may be configured as a system memory. In such DRAM-less system, DRAM 154 may be a system memory for the system in which package 100 is included. In some embodiments, one or more of DRAMs 154 may include orthogonal subarrays as described herein.

With embodiments, package 100 may be implemented within a given system implementation, which may be any type of computing device that is a shared DRAM-less system, by using memory 150 as a flat memory hierarchy. Such implementations may be possible, given the localized dense connectivity between corresponding processors 110 and memory portions 150 that may provide for dense local access on a fine-grained basis. In this way, such implementations may rely on physically close connections to localized memories 150, rather than a centralized access mechanism, such as a centralized memory controller of a processor. Further, direct connection occurs via interconnects 160 without a centralized interconnection network.

Still with reference to FIG. 1, each processor 110 may include an instruction fetch circuit 111 that is configured to fetch instructions and provide them to a scheduler 112. Scheduler 112 may be configured to schedule instructions for execution on one or more execution circuits 113, which may include arithmetic logic units (ALUs) and so forth to perform operations on data in response to decoded instructions, which may be decoded in an instruction decoder, either included within processor 110 or elsewhere within an SoC or another processor.

As further shown in FIG. 1, processor 110 also may include a load/store unit 114 that includes a memory request coalescer 115. Load/store unit 114 may handle interaction with corresponding local memory 150. To this end, each processor 110 further may include a local memory interface circuit 120 that includes a translation lookaside buffer (TLB) 125. In other implementations local memory interface circuit 120 may be separate from load/store unit 114. In embodiments herein, TLB 125 may be configured to operate on only a portion of an address space, namely that portion associated with its corresponding local memory 150. To this end, TLB 125 may include data structures that are configured for only such portion of an entire address space. For example, assume an entire address space is 64 bits corresponding to a 64-bit addressing scheme. Depending upon a particular implementation and sizing of an overall memory and individual memory portions, TLB 125 may operate on somewhere between approximately 10 and 50 bits.

Still with reference to FIG. 1, each processor 110 further includes a local cache 140 which may be implemented as a level 1 (L1) cache. Various data that may be frequently and/or recently used within processor 110 may be stored within local cache 140. In the illustration of FIG. 1, exemplary specific data types that may be stored within local cache 140 include constant data 142, texture data 144, and shared/data 146. Note that such data types may be especially appropriate when processor 110 is implemented as a graphics processing unit (GPU). Of course other data types may be more appropriate for other processing circuits, such as general-purpose processing cores or other specialized processing units.

Still referring to FIG. 1, each processor 110 may further include an inter-processor interface circuit 130. Interface circuit 130 may be configured to provide communication between a given processor 110 and its neighboring processors, e.g., a nearest neighbor on either side of processor 130.

Although embodiments are not limited in this regard, in one or more embodiments inter-processor interface circuit 130 may implement a message passing interface (MPI) to provide communication between neighboring processors. While shown at this high level in the embodiment of FIG. 1, many variations and alternatives are possible. For example, more dies may be present in a given package, including multiple memory dies that form one or more levels of a memory hierarchy and additional compute, interface, and/or controller dies.

Figure 2:
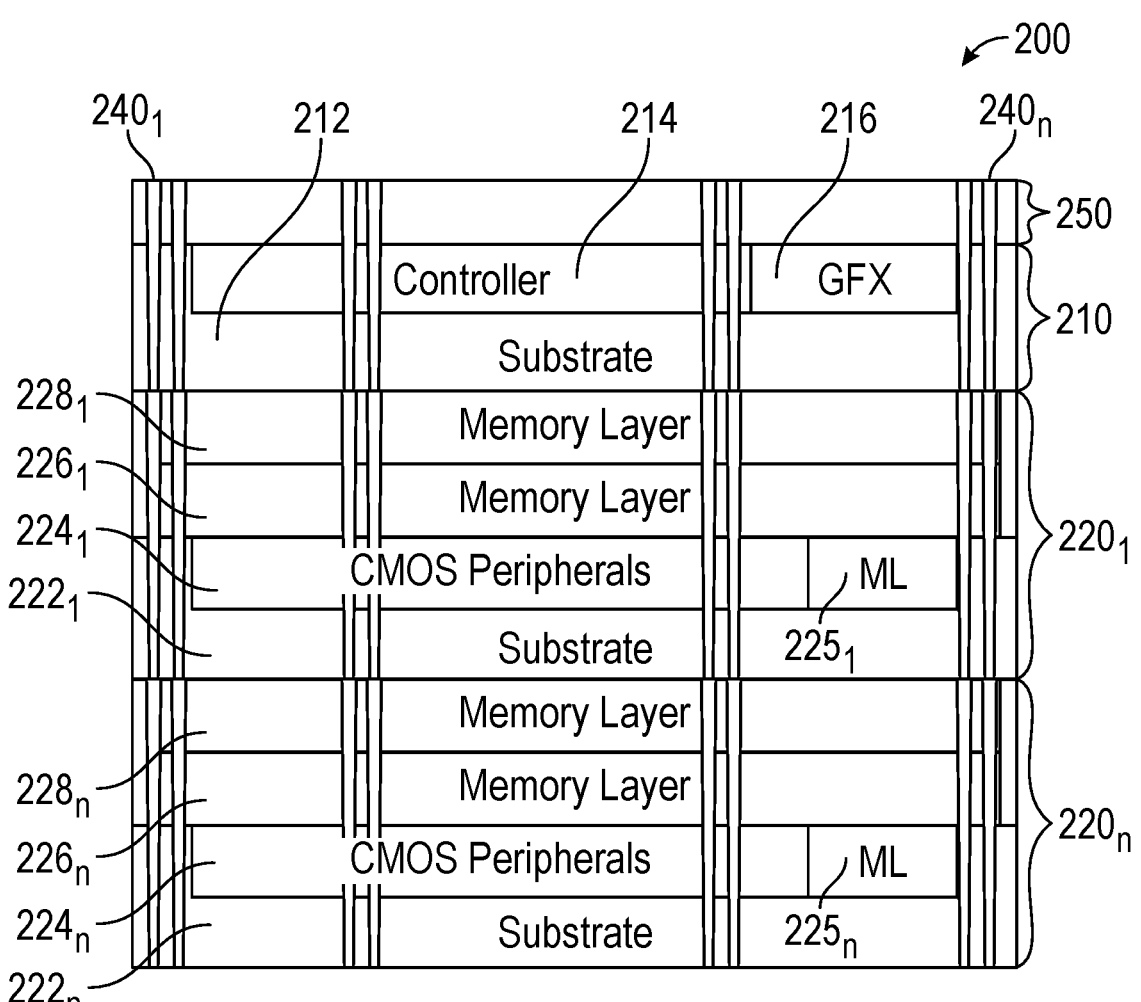
FIG. 2 is a cross sectional view of a package in accordance with an embodiment.

Referring now to FIG. 2, shown is a cross sectional view of a package in accordance with an embodiment. As shown in FIG. 2, package 200 is a multi-die package including a set of stacked die, namely a first die 210, which may be a compute die and multiple memory die $220_1$ and $220_2$. With this stacked arrangement, compute die 210 may be stacked above memory die 220 such that localized dense connectivity is realized between corresponding portions of memory die 220 and compute die 210. As further illustrated, a package substrate 250 may be present onto which the stacked dies may be adapted. In an embodiment, compute die 210 may be adapted at the top of the stack to improve cooling.

As further illustrated in FIG. 2, physical interconnection between circuitry present on the different die may be realized by TSVs $240_1$-$240_n$ (each of which may be formed of independent TSVs of each die). In this way, individual memory cells of a given portion may be directly coupled to circuitry present within compute die 210. Note further that in FIG. 2, in the cross-sectional view, only circuitry of a single processing circuit and a single memory portion is illustrated. As shown, with respect to compute die 210, a substrate 212 is provided in which controller circuitry 214 and graphics circuitry 216 is present.

With reference to memory die 220, a substrate 222 is present in which complementary metal oxide semiconductor (CMOS) peripheral circuitry 224 may be implemented, along with memory logic (ML) 225, which may include localized memory controller circuitry and/or cache controller circuitry. In certain implementations, CMOS peripheral circuitry 224 may include encryption/decryption circuitry, in-memory processing circuitry or so forth. As further illustrated, each memory die 220 may include multiple layers of memory circuitry. In one or more embodiments, there may be a minimal distance between CMOS peripheral circuitry 224 and logic circuitry (e.g., controller circuitry 214 and graphics circuitry 216) of compute die 210, such as less than one micron.

As shown, memory die 220 may include memory layers 226, 228. While shown with two layers in this example, understand that more layers may be present in other implementations. In each layer, a plurality of bit cells may be provided, such that each portion of memory die 220 provides a locally dense full width storage capacity for a corresponding locally coupled processor. Note that memory die 220 may be implemented in a manner in which the memory circuitry of layers 226, 228 may be implemented with backend of line (BEOL) techniques. While shown at this high level in FIG. 2, many variations and alternatives are possible.

In various embodiments, a DRAM may be configured to have separate portions or subarrays arranged orthogonally from each other. That is, at least one of the subarrays may have its wordlines and bitlines arranged orthogonally from the wordlines and bitlines of one or more other subarrays, including at least one neighboring subarray. In this way, certain information may be more readily accessed and used to perform additional access operations and/or computations with reduced latency and/or lower power consumption.

As one example use case, a first subarray having a first orientation may be configured to store a tag or other address information, e.g., in the form of a lookup table (LUT). Based on at least a portion of an address of a read request, this subarray may be accessed to determine whether the address corresponding to the tag is present in another subarray, e.g., a neighboring data subarray that has a second orientation orthogonal to the first orientation. If the access to the first subarray indicates a hit, a charge sharing or other precharge operation may be performed in the second subarray to enable reading of the data at the corresponding address. Otherwise, when it is determined that there is no hit in the first subarray, the expense both in latency and power consumption of performing the charge sharing operation to simply determine whether the address is present within the second subarray can be avoided.

In another use case, different subarrays may be configured to store matrices, where one subarray is configured to store a first matrix and a second subarray is configured to store a second matrix. Then to perform a matrix multiplication operation, a row (for example) of the first matrix and a column (for example) of the second matrix may be readily accessed where these subarrays are orthogonally oriented from each other. The accessed row and column data can be provided to a CMOS layer locally positioned with respect to the subarrays (e.g., as present on a lower layer of a memory die, directly under one or both of the subarrays). This CMOS layer may include multiplication circuitry to perform the matrix multiplication and then provide the resulting product to a destination location.

Figure 3:
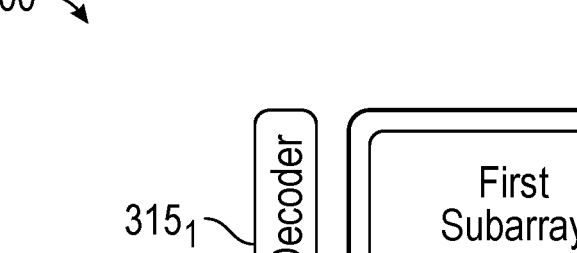
FIG. 3 is a block diagram of a memory arrangement in accordance with an embodiment.
Figure 3:
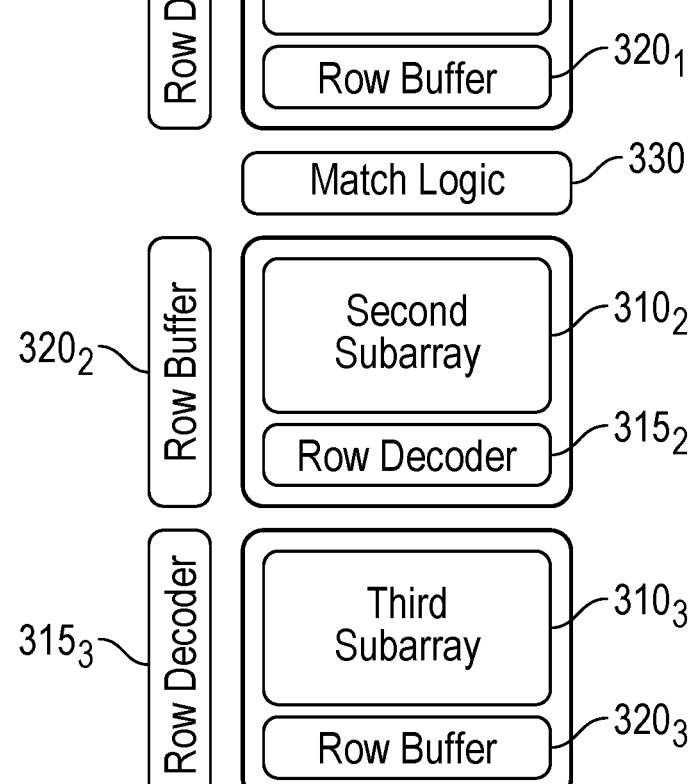

Referring now to FIG. 3, shown is a block diagram of a memory arrangement in accordance with an embodiment. As shown in FIG. 3, memory 300 may be a DRAM formed of a single semiconductor die. In general, a DRAM may be formed of a plurality of banks, where each bank includes multiple subarrays, with each subarray formed of a given number of rows and columns. For example, each subarray may have 512 rows and column widths of 8 kilobytes (kB). Note that with embodiments, at least some of the subarrays can be of heterogenous sizes (e.g., having different numbers of rows and/or widths).

In the high level view shown in FIG. 3, memory 300 includes a plurality of subarrays, namely a first subarray $310_1$, a second subarray $310_2$ and a third subarray $310_3$. In the high level shown, first subarray $310_1$ may be a source subarray, second subarray $310_2$ may be a LUT-based subarray and third subarray $310_3$ may be a destination subarray. Although shown with these limited subarrays, a given bank may have many more subarrays.

As further shown in FIG. 3, decoders and buffers may be associated with the different subarrays. Specifically, row decoders $315_{1-3}$ may be present, each associated with a corresponding one of subarrays 310. Row buffers $320_{1-3}$ also may be present, with each associated with a corresponding one of subarrays 310.

In addition, a match logic 330 may be present. In embodiments, match logic 330 may be configured to perform a comparison, on element-by-element basis, between a value in row decoder 315 and a corresponding row buffer 320. On a match, a so-called matchline signal (described further below) may be generated to cause a corresponding data element of a given subarray to be provided to an output or destination row buffer 320.

Still referring to FIG. 3, note that subarray $310_2$ may be oriented orthogonally with respect to subarrays $310_{1,3}$.

Details of this orthogonality are described further herein. In the high level of FIG. 3, it suffices to say that orientation may be along the X and Y axes; with certain subarrays having rows that are horizontally oriented and at least one other subarray having rows that are vertically oriented. Thus as shown in FIG. 3, the corresponding row buffer and row decoder associated with subarray $310_2$ also may be orthogonally oriented with respect to corresponding row buffers and row decoders of the other subarrays. While only a single orthogonal subarray is shown in FIG. 3, additional orthogonal subarrays may be present, particularly in a configuration with a large number of subarrays, e.g., per bank. Note that with this arrangement, an output of row buffer $320_2$ may be provided directly to row decoder $315_3$.

With this arrangement, for a use case in which subarray $310_2$ stores a tag-based or other LUT, on a hit the resulting information in row buffer $320_2$ may be directly provided to row decoder $315_3$ to cause charge sharing to occur within subarray $310_3$ to prepare for a read at an address associated with the hit in the LUT. Otherwise on a miss, no such charge sharing or other precharge operation occurs, reducing power consumption.

Figure 4:
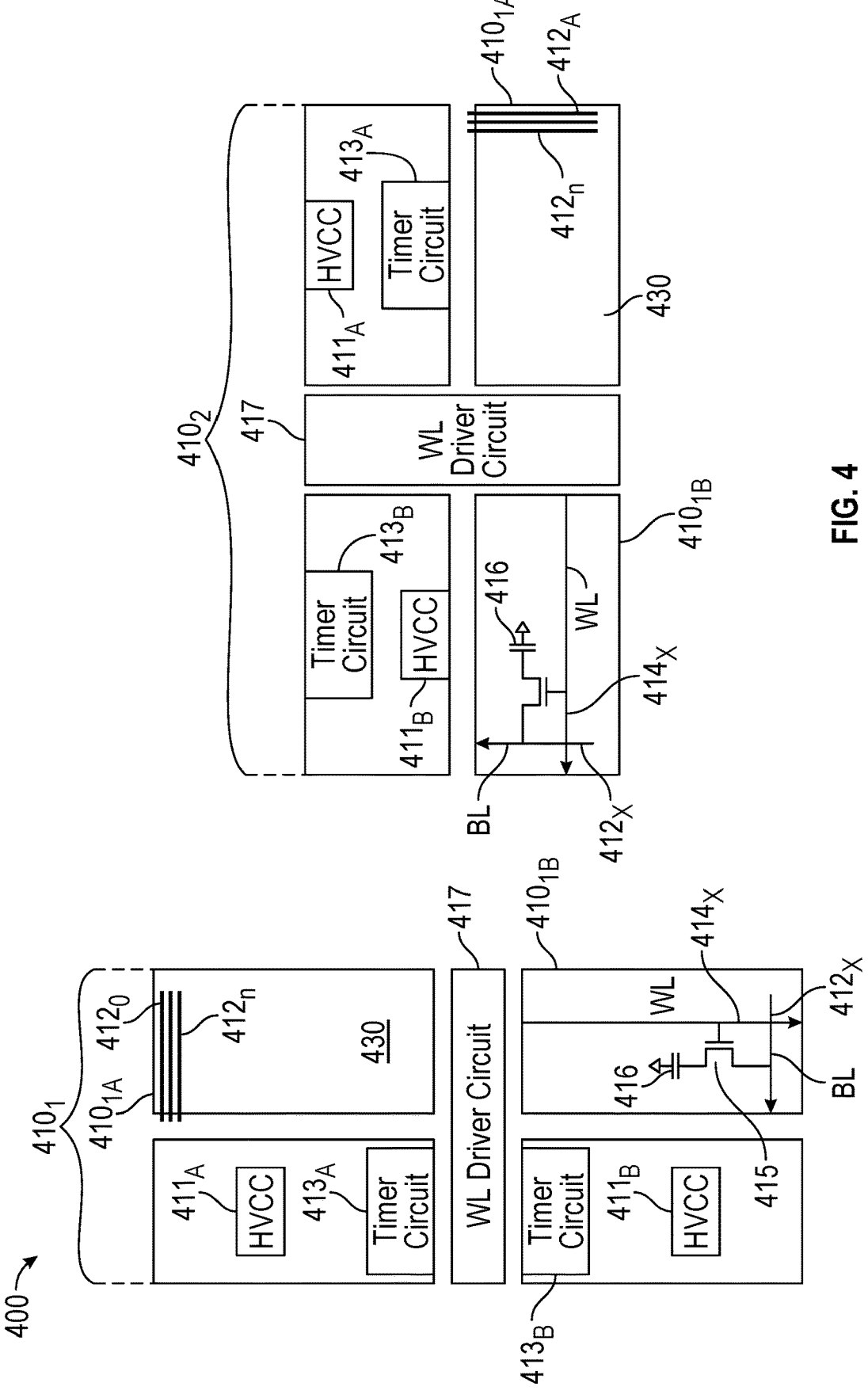
FIG. 4 is a schematic diagram illustrating the orthogonal arrangement of subarrays in accordance with an embodiment.

Referring now to FIG. 4, shown is a schematic diagram illustrating the orthogonal arrangement of subarrays in accordance with an embodiment. As shown in FIG. 4, memory 400 includes a first subarray $410_1$ having a first orientation and multiple sections $410_{1A, 1B}$. Although only two sections are shown, many more sections may be present in a given subarray. As seen, first subarray 410 has horizontally arranged bitlines $412_{0-N}$ and vertically arranged wordlines (e.g., wordline $412_X$). This subarray configuration may be configured to store LUTs or other table-based information.

Section 41018 shows a particular implementation of a bitcell to store a single bit of data. As shown the bitcell is formed of an intersection of a bitline $412_X$ and a wordline $414_X$. As shown, wordline $414_X$ couples to a gate terminal of a transistor 415 (e.g., a p-type metal oxide semiconductor (PMOS) transistor) having one of a source or drain terminal coupled to bitline $412_X$ and the other terminal of which is coupled to a capacitor 416 (having another plate coupled to a ground reference). As further shown, a wordline (WL) driver circuit 417 is horizontally adapted and may couple to corresponding wordlines of the different portions. While not shown for ease of illustration each subarray 410 may include corresponding row buffers and decoders.

Still referring to subarray $410_1$, additional circuitry may be present, including high voltage control circuitry (HVCC) ($411_{A,B}$) and timer circuits $413_{A, B}$. In addition, FIG. 4 is arranged as a top view where all the above-described circuitry is adapted above a CMOS layer 430, which may underly some or all of subarray sections $410_{1A, 1B}$. CMOS layer 430 may include various logic circuitry for controlling the memory and further include computation circuitry for performing memory-local computations as described herein, such as multiplication circuitry to perform matrix multiplication operations as described herein.

Still with reference to FIG. 4, another subarray $410_2$ may have an orthogonal orientation. In the high level shown in FIG. 4, in this orientation, wordlines may be horizontally aligned and bitlines vertically aligned, where this subarray is configured to store data. Although shown at this high level in the embodiment of FIG. 4, many variations and alternatives are possible. For example in some implementations, each of the subarrays may be formed of the same type of memory cells, e.g., one-transistor-one capacitor (1T-1C) bitcells. In other cases, at least those subarrays that are to be configured for LUT-based storage may have a 2T-1C configuration. In either implementation it is further possible for there to be matchlines that couple to a sense amplifier and/or other switch, where such matchlines may provide matchline signals from match logic, as described above.

Figure 5A:
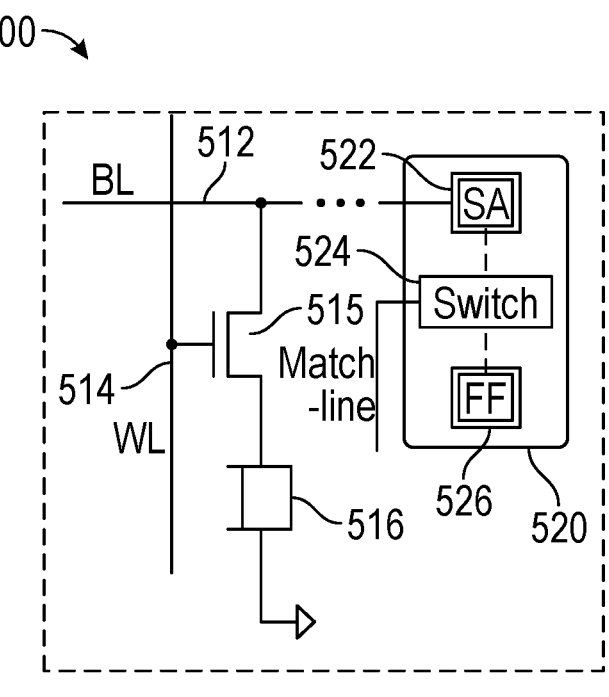
FIGS. 5A and 5B are schematic diagrams of example bitcells in accordance with embodiments.

Referring now to FIG. 5A, shown is a schematic diagram of an example bitcell in accordance with a first embodiment. As shown in FIG. 5A, bitcell 500 may be a bitcell of a LUT-based subarray in which bitlines are adapted in a first direction and wordlines in a second, orthogonal direction. This is so, since as discussed above, this subarray may be configured to store a LUT or other stored table with a different orientation to realize faster accesses.

As illustrated in FIG. 5A, a bitline (BL) 512 may be horizontally arranged while a corresponding wordline 514 may be vertically arranged. As further illustrated, a transistor 515 has a gate terminal coupled to wordline 514 and one of a source or drain terminal coupled to bitline 512, with the other terminal coupled to a capacitor 516 having another plate coupled to a ground node.

A sense amplifier (SA) circuit 520 may include a sense amplifier 522 directly coupled to bitline 512. In addition, a switch 524 couples between sense amplifier 522 and a flip-flop (FF) 526. As illustrated, a matchline may provide control of switch 524. With this arrangement, when switch 524 is enabled by a matchline signal (received from match logic), data in sense amplifier 522 may be stored into flip-flop 526, which acts as a buffer. In this way, by driving each matchline signal independently, data in a row buffer can be partially written to a corresponding flip-flop buffer formed of multiple flip-flops 526.

Other configurations are possible. For example, a matchline may couple to a switch that in turn couples between a bitline and a sense amplifier, potentially avoiding the need for a flip-flop. In yet another implementation, a bitcell may have a 2T-1C configuration in which the matchline can be gated by the second transistor that couples in series with the first transistor and which is gated by the matchline signal.

Figure 5B:
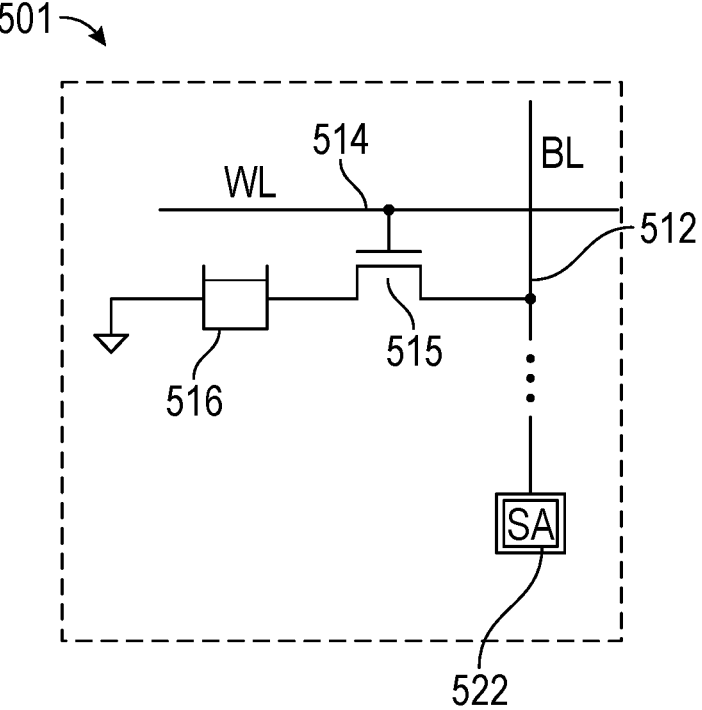

Referring now to FIG. 5B, shown is a block diagram of a bitcell in accordance with another embodiment. More specifically as shown in FIG. 5B, bitcell 501 may be arranged with an orthogonal orientation to that of bitcell 500. Thus as shown, bitline 512 is vertically oriented and wordline 514 is horizontally oriented. Note also in this configuration the additional matchline input to sense amplifier circuitry is not present as bitcell 501 may be configured for use in subarrays that are configured for data storage rather than lookup table-based operations. Understand while shown with these examples in FIG. 5A, 5B, many variations and alternatives are possible.

Figure 5C:
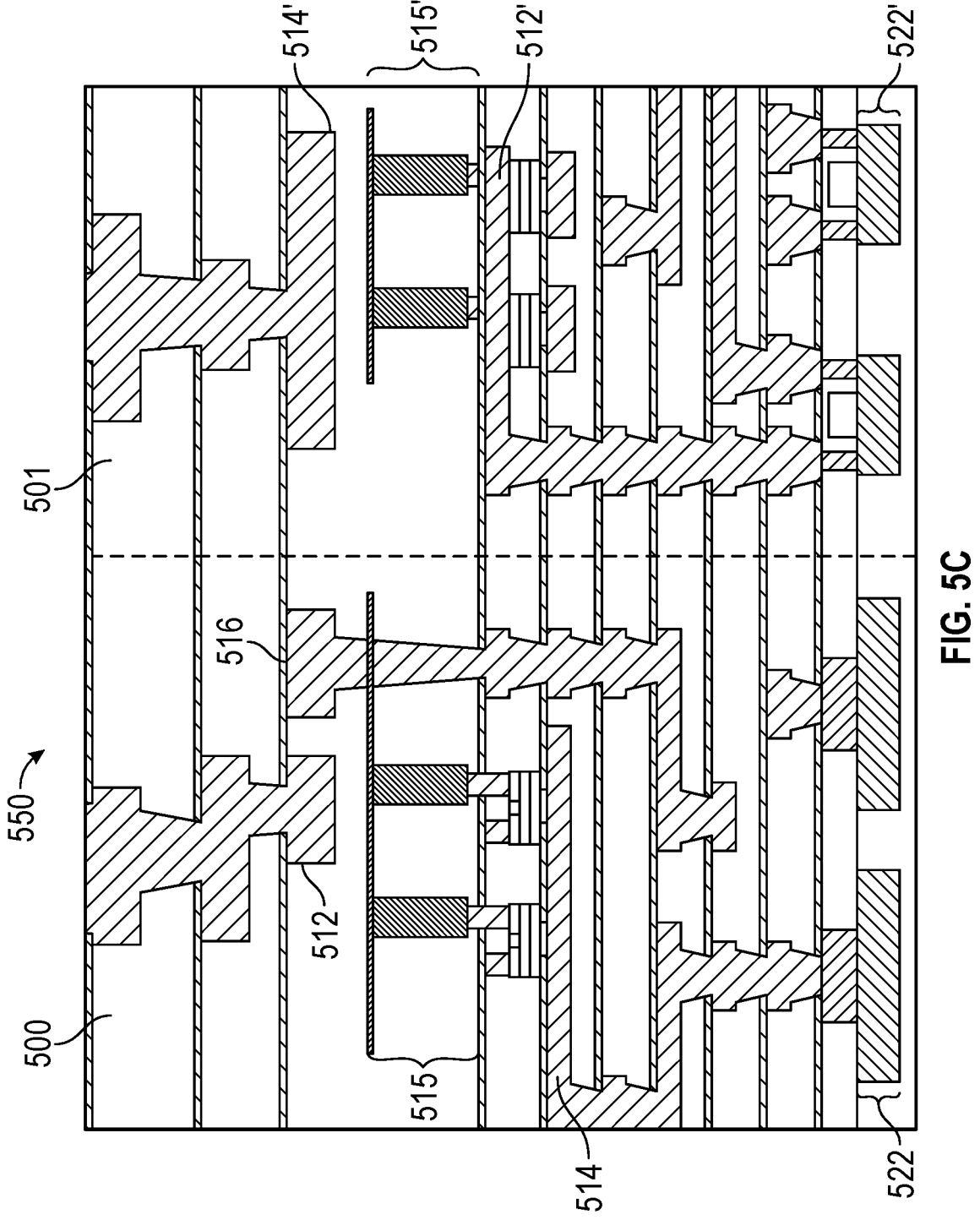
FIG. 5C is a cross-sectional view of a memory die in accordance with an embodiment.

Referring now to FIG. 5C, shown is a cross-sectional view of a memory die in accordance with an embodiment. FIG. 5C continues the numbering of FIGS. 5A and 5B. Thus as shown in this cross section, neighboring subarrays have orthogonally oriented bitcells. More specifically, bitlines 512 in bitcell 500 of a first orientation have travel into/out of the figure, while bitlines 512' in bitcell 501 have an orthogonal orientation, i.e., travel along the figure. Similar orthogonal orientations of wordlines 514 and 514' and transistors 515 are also seen. FIG. 5C further shows location of capacitors 516 (516') and sense amplifiers 522 (522'). Note that sense amplifiers 522 may present in a CMOS layers of the memory die, while at least some of the memory circuitry may be present in one or more back end of line (BEOL) layers.

Figure 6:
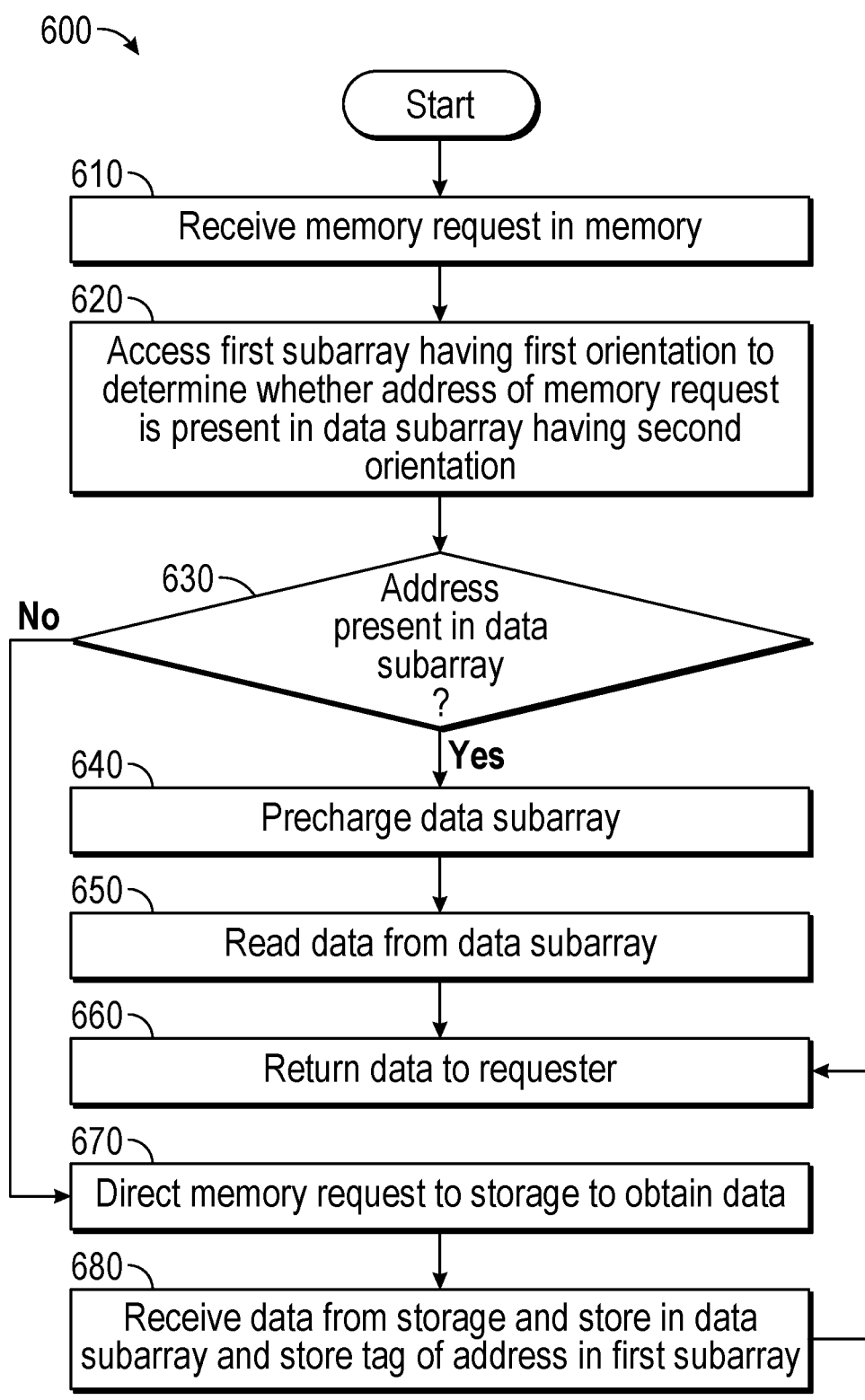
FIG. 6 is a flow diagram of a method in accordance with an embodiment.

Referring now to FIG. 6, shown is a flow diagram of a method in accordance with an embodiment. As shown in FIG. 6, method 600 is a method for performing a read operation from a memory in accordance with an embodiment. As such, method 600 may be performed by hardware circuitry present in the memory. Such hardware circuitry, alone and/or in combination with firmware and/or software may execute method 600.

As illustrated, method 600 begins by receiving a memory request in the memory (block 610). Assume for purposes of discussion that this memory request is a read request. In response to the read request, control passes to block 620 where a first subarray having a first orientation may be accessed to determine whether an address of the memory request is present in a data subarray that has a second, orthogonal orientation. Based on this access (which acts as a tag lookup), it may be determined at diamond 630 whether the address is present in the data subarray. If so, control passes to block 640 where the data subarray may be precharged, which may include a charge sharing operation. Next at block 650, the data is read from the data subarray and at block 660 the data is returned to a requester.

Still referring to FIG. 6, instead if it is determined at diamond 630 that the address is not present in the data array, the precharge operations can be avoided. Instead control passes to block 670 where the memory request may be directed to a higher portion of a memory hierarchy, e.g., a storage, to obtain the data. Thereafter at block 680, the data may be received from the storage and stored in the data subarray. In addition, a tag of the address, e.g., a given predetermined portion of the address, may be stored as a tag in the first subarray, to be later accessed as a LUT. Then the data can be returned to the requester (block 660). While shown at this high level in the embodiment of FIG. 6, many variations and alternatives are possible.

Figure 7:
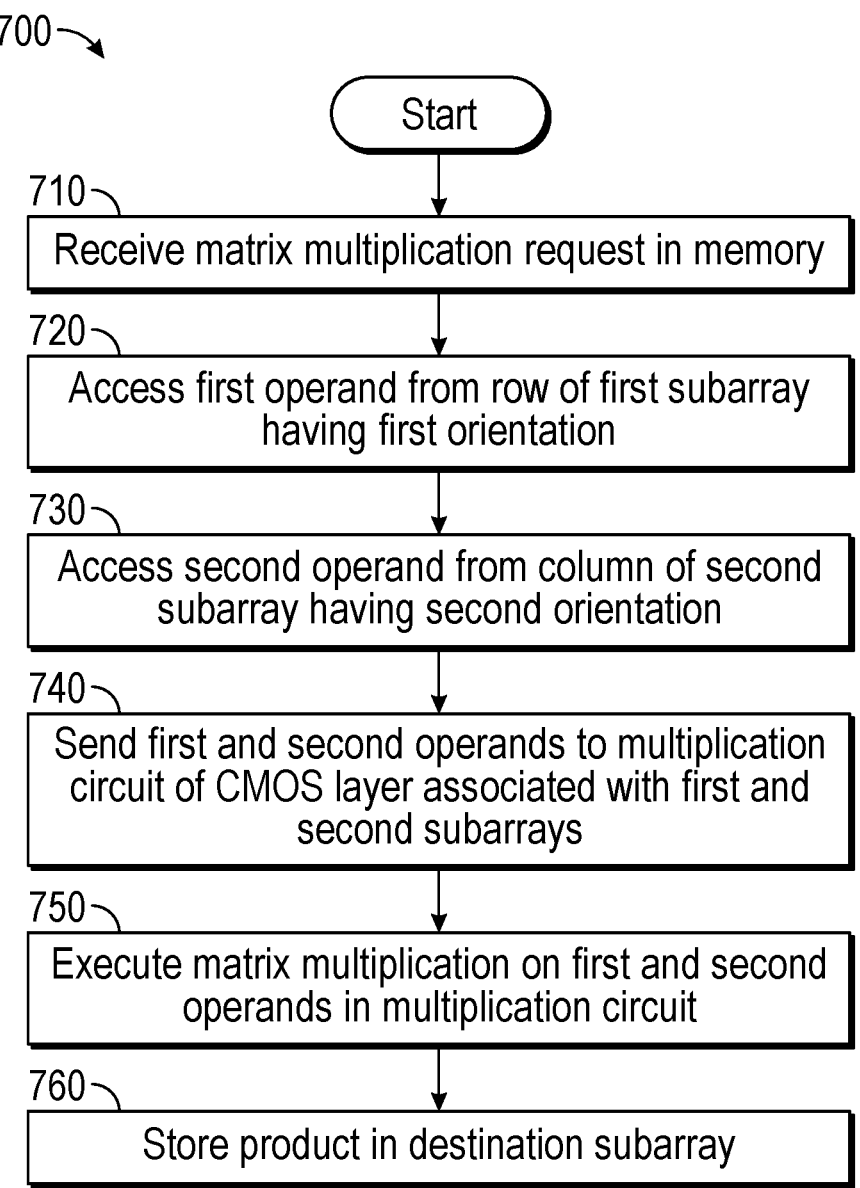
FIG. 7 is a flow diagram of a method in accordance with another embodiment.

Referring now to FIG. 7, shown is a flow diagram of a method in accordance with another embodiment. As illustrated, method 700 is a method for performing a matrix multiplication operation in a memory in accordance with an embodiment. As such, method 700 may be performed by hardware circuitry present in the memory. Such hardware circuitry, alone and/or in combination with firmware and/or software may execute method 700.

Method 700 begins by receiving a matrix multiplication request (e.g., for a matrix product) in the memory (block 710). In response to this request, at block 720 a first operand for the multiplication may be accessed from a row of a first subarray having a first orientation. Similar access may occur at block 730 for a second operand, which may be accessed from a column of a second subarray. That is, owing to the construction differences of neighboring subarrays that have different orientations, faster accesses to row and column data may be realized, since in the second subarray the column data may actually be stored in row arrangement.

Still with reference to FIG. 7 at block 740, the two operands may be sent to a multiplication circuit. This multiplication circuit may be present in CMOS circuitry present within the memory die itself, reducing latency. For example, the multiplication circuitry may be located directly below one or both of the accessed subarrays. As such, a faster matrix multiplication may be performed with reduced latency. Of course in other cases, the multiplication circuitry may be present in another die, e.g., of a stacked die arrangement.

As shown in FIG. 7 at block 750, the matrix multiplication of the two operands may be executed in this multiplication circuit, e.g., each row element with each column element, the products of which may be summed. Finally at block 760, the product of this matrix multiplication may be stored in a destination subarray, e.g., a different subarray to store the resulting matrix multiplication product. Similar matrix multiplications and additions can be performed for additional rows and columns of the matrices. Although shown at this high level in FIG. 7, variations and alternatives are possible.

Packages in accordance with embodiments can be incorporated in many different system types, ranging from small portable devices such as a smartphone, laptop, tablet or so forth, to larger systems including client computers, server computers and datacenter systems.

Figure 8:
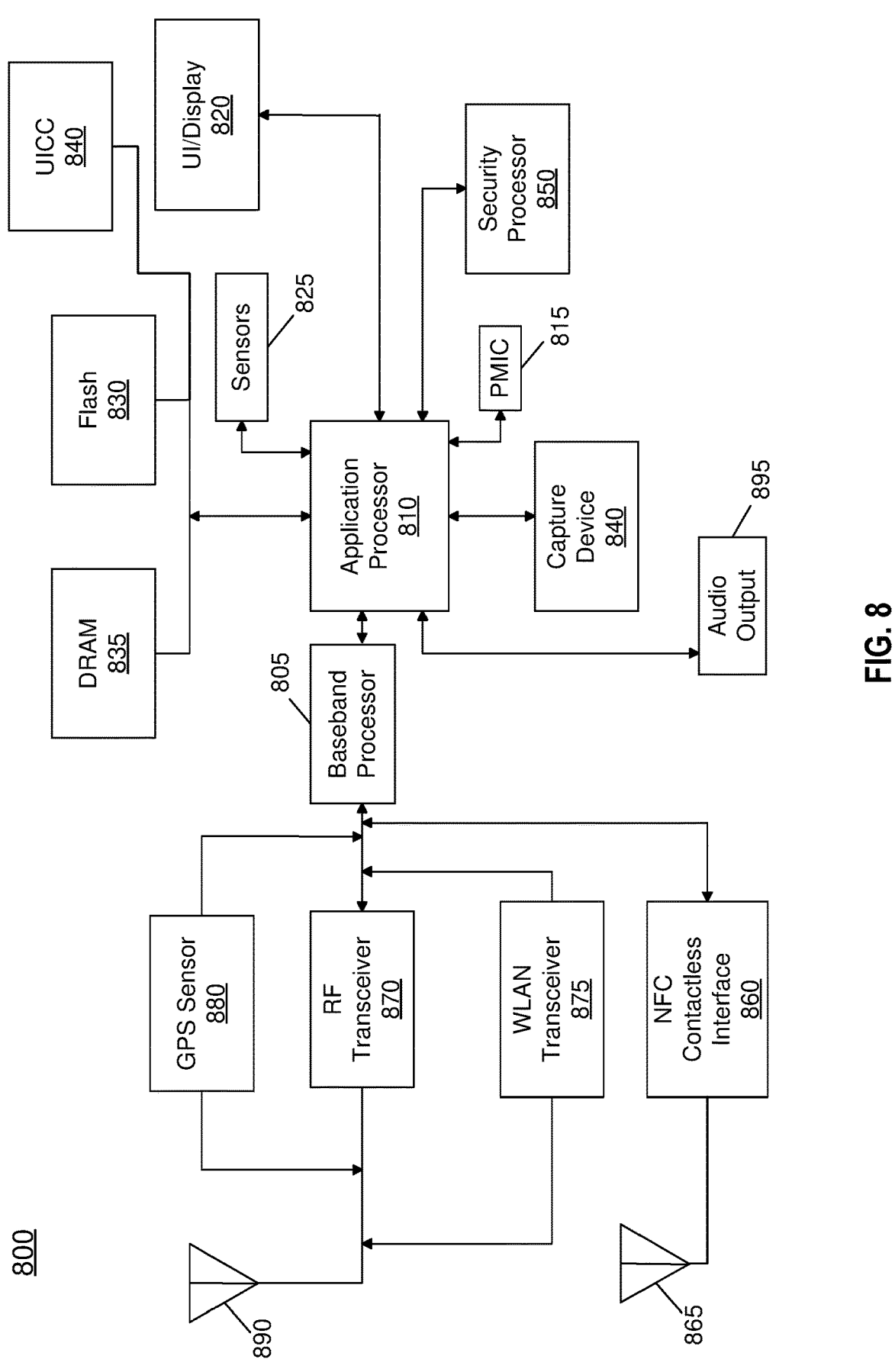
FIG. 8 is a block diagram of an example system with which embodiments can be used.

Referring now to FIG. 8, shown is a block diagram of an example system with which embodiments can be used. As seen, system 800 may be a smartphone or other wireless communicator. A baseband processor 805 is configured to perform various signal processing with regard to communication signals to be transmitted from or received by the system. In turn, baseband processor 805 is coupled to an application processor 810, which may be a main CPU of the system to execute an OS and other system software, in addition to user applications such as many well-known social media and multimedia apps. Application processor 810 may further be configured to perform a variety of other computing operations for the device.

In turn, application processor 810 can couple to a user interface/display 820, e.g., a touch screen display. In addition, application processor 810 may couple to a memory system including a non-volatile memory, namely a flash memory 830 and a system memory, namely a dynamic random access memory (DRAM) 835. In embodiments herein, a package may include multiple dies including at least processor 810 and DRAM 835, which may be stacked and configured as described herein. As further seen, application processor 810 further couples to a capture device 840 such as one or more image capture devices that can record video and/or still images.

Still referring to FIG. 8, a universal integrated circuit card (UICC) 840 comprising a subscriber identity module and possibly a secure storage and cryptoprocessor is also coupled to application processor 810. System 800 may further include a security processor 850 that may couple to application processor 810. A plurality of sensors 825 may couple to application processor 810 to enable input of a variety of sensed information such as accelerometer and other environmental information. An audio output device 895 may provide an interface to output sound, e.g., in the form of voice communications, played or streaming audio data and so forth.

As further illustrated, a near field communication (NFC) contactless interface 860 is provided that communicates in a NFC near field via an NFC antenna 865. While separate antennae are shown in FIG. 8, understand that in some implementations one antenna or a different set of antennae may be provided to enable various wireless functionality.

Figure 9:
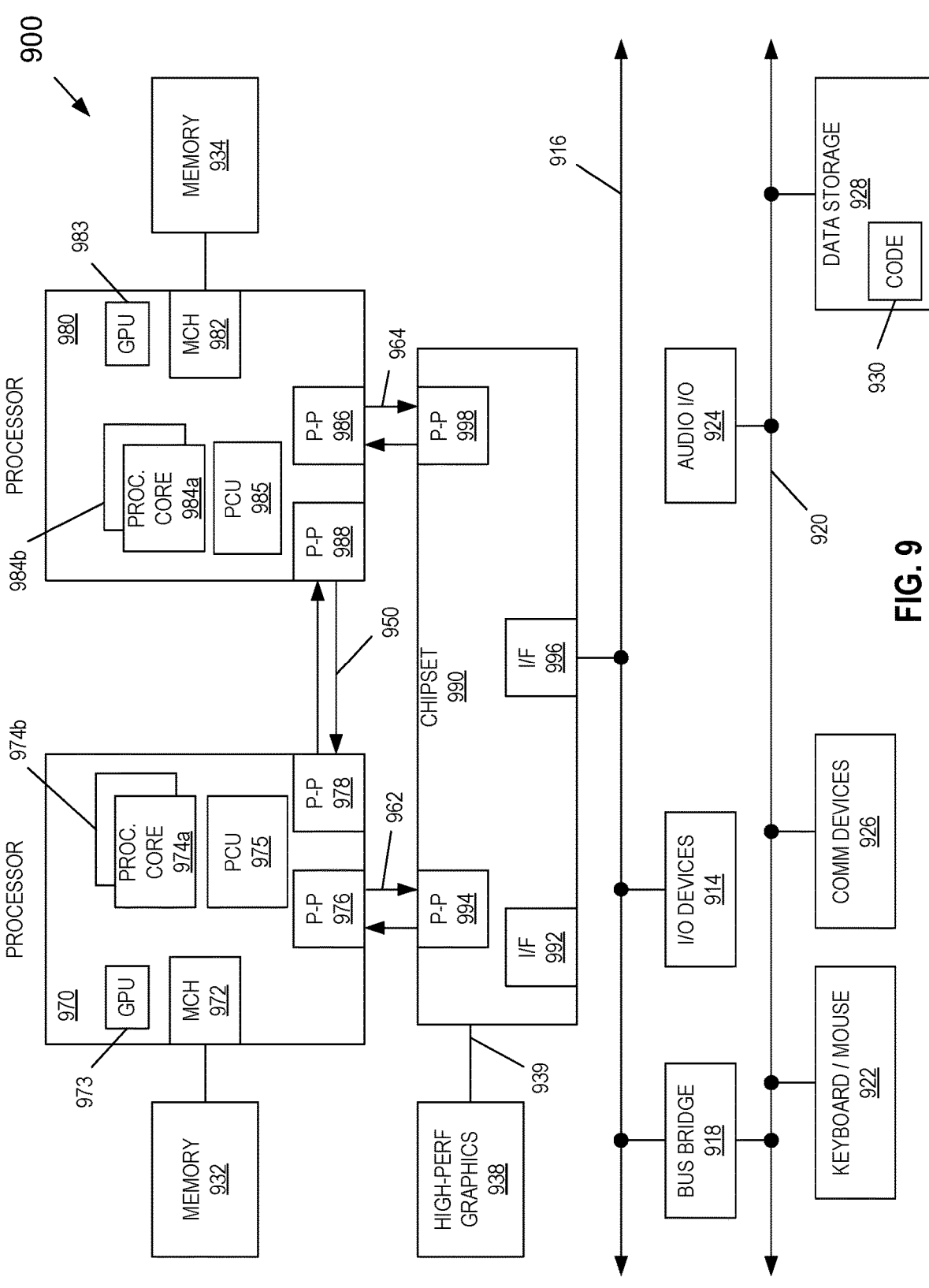
FIG. 9 is a block diagram of a system in accordance with another embodiment.

Embodiments may be implemented in other system types such as client or server systems. Referring now to FIG. 9, shown is a block diagram of a system in accordance with another embodiment. As shown in FIG. 9, multiprocessor system 900 is a point-to-point interconnect system, and includes a first processor 970 and a second processor 980 coupled via a point-to-point interconnect 950. As shown in FIG. 9, each of processors 970 and 980 may be multicore processors, including first and second processor cores (i.e., processors 974a and 974b and processor cores 984a and 984b), although potentially many more cores may be present in the processors. In addition, each of processors 970 and 980 also may include a graphics processor unit (GPU) 973, 983 to perform graphics operations. Each of the processors can include a power control unit (PCU) 975, 985 to perform processor-based power management.

Still referring to FIG. 9, first processor 970 further includes a memory controller hub (MCH) 972 and point-to-point (P-P) interfaces 976 and 978. Similarly, second processor 980 includes a MCH 982 and P-P interfaces 986 and 988. As shown in FIG. 9, MCH's 972 and 982 couple the processors to respective memories, namely a memory 932 and a memory 934, which may be portions of system memory (e.g., DRAM) locally attached to the respective processors. In embodiments herein, one or more packages may include multiple dies including at least processor 970 and memory 932 (e.g.), which may be stacked and configured as described herein.

First processor 970 and second processor 980 may be coupled to a chipset 990 via P-P interconnects 962 and 964, respectively. As shown in FIG. 9, chipset 990 includes P-P interfaces 994 and 998. Furthermore, chipset 990 includes an interface 992 to couple chipset 990 with a high performance graphics engine 938, by a P-P interconnect 939. In turn, chipset 990 may be coupled to a first bus 916 via an interface 996.

As shown in FIG. 9, various input/output (I/O) devices 914 may be coupled to first bus 916, along with a bus bridge 918 which couples first bus 916 to a second bus 920. Various devices may be coupled to second bus 920 including, for example, a keyboard/mouse 922, communication devices 926 and a data storage unit 928 such as a disk drive or other mass storage device which may include code 930, in one embodiment. Further, an audio I/O 924 may be coupled to second bus 920.

Figure 10:
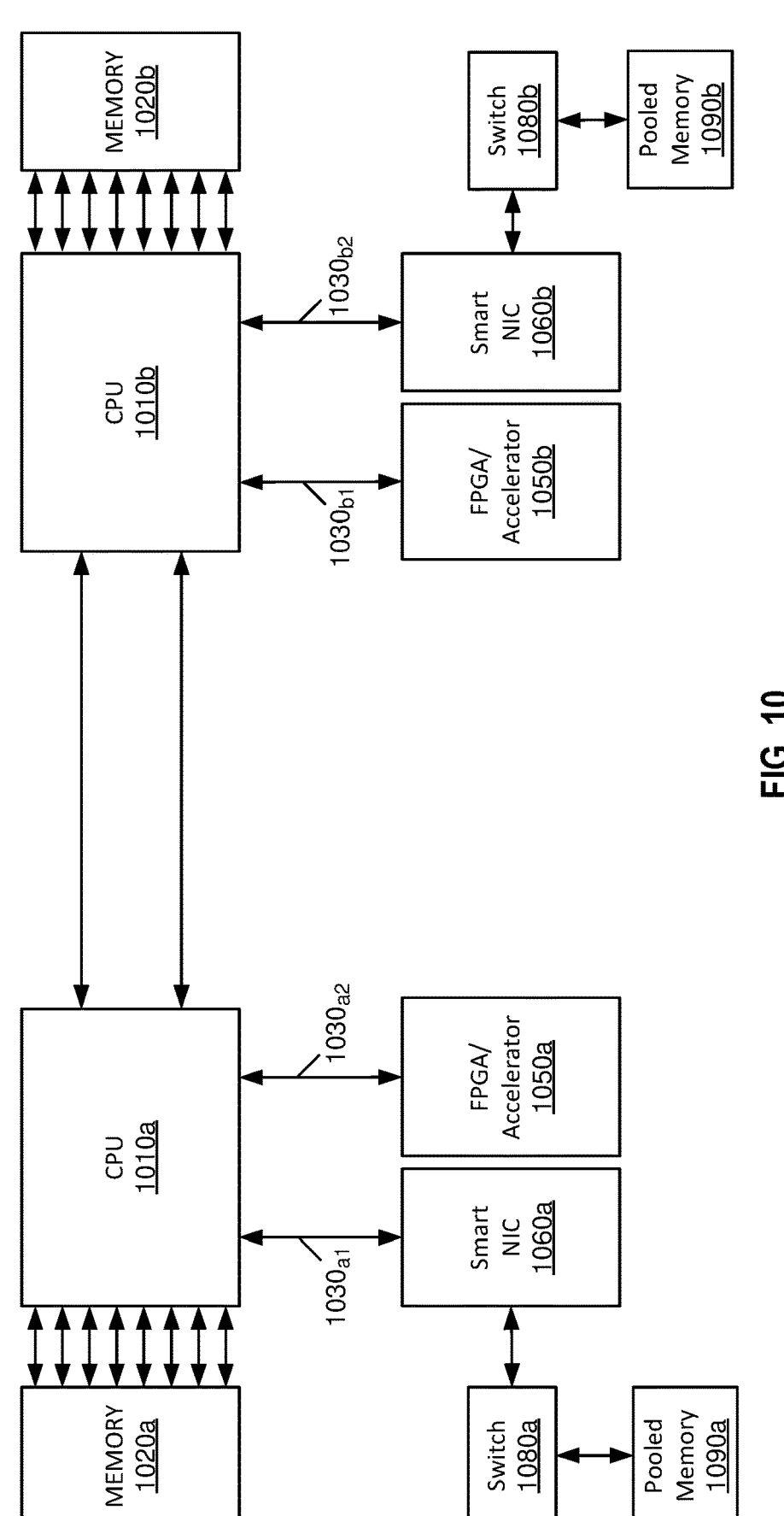
FIG. 10 is a block diagram of a system in accordance with another embodiment.

Referring now to FIG. 10, shown is a block diagram of a system 1000 in accordance with another embodiment. As shown in FIG. 10, system 1000 may be any type of computing device, and in one embodiment may be a datacenter system. In the embodiment of FIG. 10, system 1000 includes multiple CPUs 1010a,b that in turn couple to respective system memories 1020a,b which in embodiments may be implemented with DRAM in accordance with one or more embodiments. Note that CPUs 1010 may couple together via an interconnect system 1015 implementing a coherency protocol. In embodiments herein, one or more packages may include multiple dies including at least CPU 1010 and system memory 1020 (e.g.), which may be stacked and configured as described herein.

To enable coherent accelerator devices and/or smart adapter devices to couple to CPUs 1010 by way of potentially multiple communication protocols, a plurality of interconnects 1030a1-b2 may be present. In the embodiment shown, respective CPUs 1010 couple to corresponding field programmable gate arrays (FPGAs)/accelerator devices 1050a,b (which may include GPUs, in one embodiment). In addition CPUs 1010 also couple to smart NIC devices 1060a,b. In turn, smart NIC devices 1060a,b couple to switches 1080a,b that in turn couple to a pooled memory 1090a,b such as a persistent memory.

Figure 11:
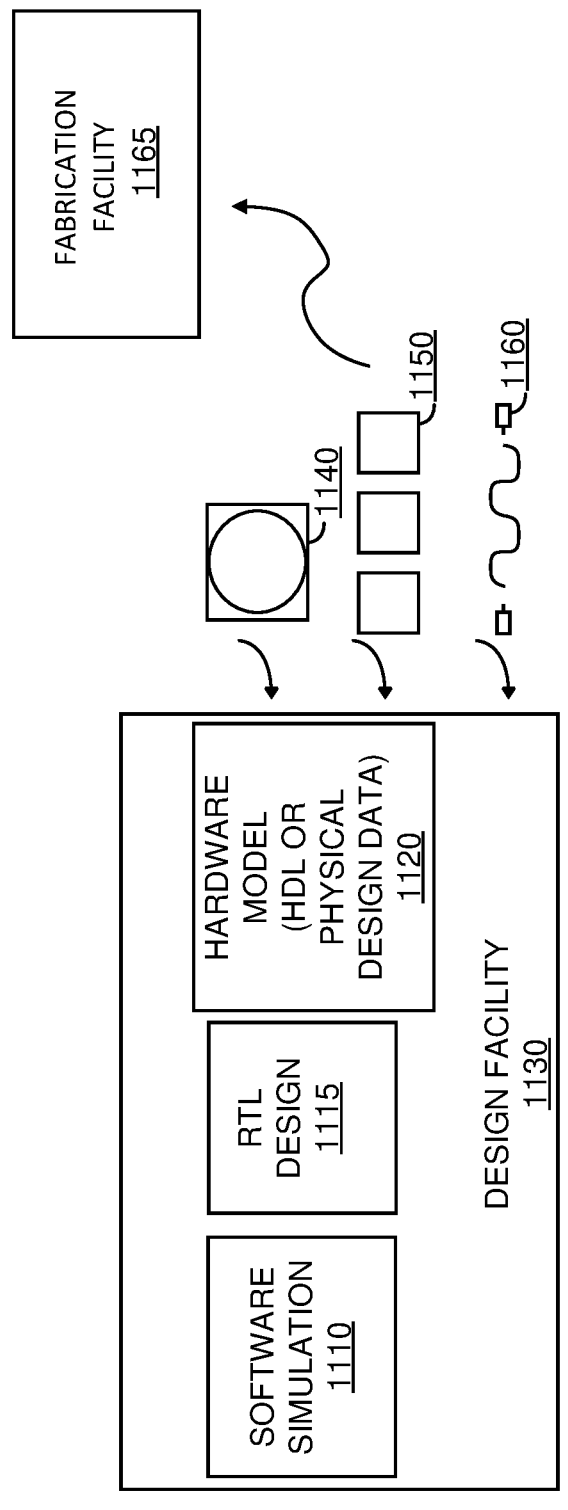
FIG. 11 is a block diagram illustrating an IP core development system used to manufacture an integrated circuit to perform operations according to an embodiment.

FIG. 11 is a block diagram illustrating an IP core development system 1100 that may be used to manufacture integrated circuit dies that can in turn be stacked to realize multi-die packages according to an embodiment. The IP core development system 1100 may be used to generate modular, re-usable designs that can be incorporated into a larger design or used to construct an entire integrated circuit (e.g., an SoC integrated circuit). A design facility 1130 can generate a software simulation 1110 of an IP core design in a high level programming language (e.g., C/C++). The software simulation 1110 can be used to design, test, and verify the behavior of the IP core. A register transfer level (RTL) design can then be created or synthesized from the simulation model. The RTL design 1115 is an abstraction of the behavior of the integrated circuit that models the flow of digital signals between hardware registers, including the associated logic performed using the modeled digital signals. In addition to an RTL design 1115, lower-level designs at the logic level or transistor level may also be created, designed, or synthesized. Thus, the particular details of the initial design and simulation may vary.

The RTL design 1115 or equivalent may be further synthesized by the design facility into a hardware model 1120, which may be in a hardware description language (HDL), or some other representation of physical design data. The HDL may be further simulated or tested to verify the IP core design. The IP core design can be stored for delivery to a third party fabrication facility 1165 using non-volatile memory 1140 (e.g., hard disk, flash memory, or any non-volatile storage medium). Alternately, the IP core design may be transmitted (e.g., via the Internet) over a wired connection 1150 or wireless connection 1160. The fabrication facility 1165 may then fabricate an integrated circuit that is based at least in part on the IP core design. The fabricated integrated circuit can be configured to be implemented in a package and perform operations in accordance with at least one embodiment described herein.

The following examples pertain to further embodiments.

In one example, an apparatus comprises: a first subarray having a first plurality of memory cells, the first subarray having a first orientation of bitlines and wordlines; and a second subarray having a second plurality of memory cells, the second subarray having a second orientation of bitlines and wordlines, the second orientation orthogonal to the first orientation.

In an example, the first subarray having the first orientation comprises: a first plurality of bitlines adapted in a first direction; and a first plurality of wordlines adapted in a second direction orthogonal to the first direction.

In an example, the second subarray having the second orientation comprises: a second plurality of bitlines adapted in the second direction orthogonal to the first orientation; and a second plurality of wordlines adapted in the first direction.

In an example: the first subarray is associated with a row decoder adapted in the first direction and a row buffer adapted in the second direction; and the second subarray is associated with a row decoder adapted in the second direction and a row buffer adapted in the first direction.

In an example, the second subarray is to store a LUT comprising tag information and, in response to a hit in the LUT of at least a portion of an address of a read request, a charge sharing operation is to occur in another subarray to enable data at the address to be read from the another subarray.

In an example, in response to a miss in the LUT of at least the portion of the address, the charge sharing operation does not occur.

In an example, the apparatus comprises a memory die having a CMOS layer comprising a computation circuit, where a first portion of the computation circuit is adapted on the CMOS layer in association with the first subarray and the second subarray.

In an example, the first portion of the computation circuit is to perform a matrix multiplication between row data obtained from the first subarray and column data obtained from the second subarray.

In an example, the apparatus further comprises: a third subarray having a third plurality of memory cells, the third subarray having the first orientation.

In an example, the first subarray comprises a source subarray, the second subarray comprises a LUT subarray, and the third subarray comprises a destination subarray, and wherein the second subarray is associated with a second row buffer and the third subarray is associated with a third row decoder, wherein the second row buffer and the third row decoder have a common orientation.

In an example, the second row buffer is directly coupled to the third row decoder, wherein the second row buffer is to provide address information to the third row decoder to enable the third row decoder to access the third subarray.

In an example, a latency to read information from the second subarray is less than a latency to read information from the first subarray.

In another example, a method comprises: receiving, in a memory, a read request having an address; accessing a first subarray of the memory using at least a portion of the address, the first subarray having a first orientation, to determine whether the at least portion of the address is a hit in the first subarray; and in response to the hit in the first subarray, precharging a second subarray having a second orientation and reading data from the address in the second subarray.

In an example, the method further comprises, in response to a miss in the first subarray, sending the read request to a storage without precharging the second subarray.

In an example, the method further comprises in response to the hit in the first subarray, providing information from a row buffer of the first subarray to a row decoder of the second subarray.

In an example, the method further comprises: receiving, in the memory, a matrix multiplication request; accessing a first operand stored in a third subarray of the memory, the third subarray having the first orientation, the first operand comprising row data of a first matrix; accessing a second operand stored in a fourth subarray of the memory, the fourth subarray having the second orientation, the second operand comprising column data of a second matrix; and sending the first operand and the second operand to a computation circuit, to cause the computation circuit to perform a matrix multiplication between the first operand and the second operand.

In an example, the method further comprises sending the first operand and the second operand from at least one memory layer of a memory die to a CMOS layer of the memory die, the CMOS layer comprising the computation circuit.

In another example, a computer readable medium including instructions is to perform the method of any of the above examples.

In a further example, a computer readable medium including data is to be used by at least one machine to fabricate at least one integrated circuit to perform the method of any one of the above examples.

In a still further example, an apparatus comprises means for performing the method of any one of the above examples.

In another example, a package comprises: a first die comprising a CPU; and a second die comprising a memory, where the first die is adapted on the second die. The memory may comprises: a first subarray having a first plurality of memory cells, the first subarray having a first orientation and associated with a first row decoder and a first row buffer; and a second subarray having a second plurality of memory cells, the second subarray having a second orientation, the second orientation orthogonal to the first orientation, the second subarray associated with a second row decoder and a second row buffer, wherein the first row buffer is to provide information from the first subarray directly to the second row decoder.

In an example, the first subarray is configured to store a table, wherein in response to a read request having an address, at least a portion of which is a hit in the first subarray, the memory is to precharge the second subarray to effect a read operation for the read request.

In an example, the second die further comprises a CMOS layer comprising computation circuitry, wherein in response to a matrix multiplication request, the computation circuit is to perform a matrix multiplication between: a first operand obtained from the first subarray, the first operand comprising row data of a first matrix; and a second operand obtained from the second subarray, the second operand comprising column data of a second matrix.

In yet another example, an apparatus comprises: means for receiving a read request having an address; means for accessing a first subarray means of memory means using at least a portion of the address, the first subarray means having a first orientation, to determine whether the at least portion of the address hits in the first subarray means; means for precharging, in response to the hit in the first subarray means, a second subarray means having a second orientation; and means for reading data from the address in the second subarray means.

In an example, the apparatus further comprises: means for not precharging, in response to a miss in the first subarray means, the second subarray means; and means for sending the read request to a storage means.

In an example, the apparatus further comprises means for directly providing information from row buffer means of the first subarray means to row decoder means of the second subarray means.

In an example, the apparatus further comprises: means for receiving a matrix multiplication request; means for accessing a first operand stored in a third subarray means of the memory means, the third subarray means having the first orientation, the first operand comprising row data of a first matrix; means for accessing a second operand stored in a fourth subarray means of the memory means, the fourth subarray means having the second orientation, the second operand comprising column data of a second matrix; and means for sending the first operand and the second operand to a computation means for performing a matrix multiplication between the first operand and the second operand.

Understand that various combinations of the above examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SOC or other processor, is to configure the SOC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EE-PROMs), magnetic or optical cards, or any other type of media suitable for storing electronic instructions.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus comprising:
   a first subarray having a first plurality of memory cells, the first subarray having a first orientation of bitlines and wordlines; and
   a second subarray having a second plurality of memory cells, the second subarray having a second orientation of bitlines and wordlines, the second orientation orthogonal to the first orientation.

2. The apparatus of claim 1, wherein the first subarray having the first orientation comprises:
   a first plurality of bitlines adapted in a first direction; and
   a first plurality of wordlines adapted in a second direction orthogonal to the first direction.

3. The apparatus of claim 2, wherein the second subarray having the second orientation orthogonal to the first orientation comprises:
   a second plurality of bitlines adapted in the second direction; and
   a second plurality of wordlines adapted in the first direction.

4. The apparatus of claim 3, wherein:
   the first subarray is associated with a row decoder adapted in the first direction and a row buffer adapted in the second direction; and
   the second subarray is associated with a row decoder adapted in the second direction and a row buffer adapted in the first direction.

5. The apparatus of claim 1, wherein the second subarray is to store a lookup table (LUT) comprising tag information and, in response to a hit in the LUT of at least a portion of an address of a read request, a charge sharing operation is to occur in another subarray to enable data at the address to be read from the another subarray.

6. The apparatus of claim 5, wherein in response to a miss in the LUT of at least the portion of the address, the charge sharing operation does not occur.

7. The apparatus of claim 1, wherein the apparatus comprises a memory die having a complementary metal oxide semiconductor (CMOS) layer comprising a computation circuit, wherein a first portion of the computation circuit is adapted on the CMOS layer in association with the first subarray and the second subarray.

8. The apparatus of claim 7, wherein the first portion of the computation circuit is to perform a matrix multiplication between row data obtained from the first subarray and column data obtained from the second subarray.

9. The apparatus of claim 1, further comprising:

a third subarray having a third plurality of memory cells, the third subarray having the first orientation.

10. The apparatus of claim 9, wherein the first subarray comprises a source subarray, the second subarray comprises a lookup table (LUT) subarray, and the third subarray comprises a destination subarray, and wherein the second subarray is associated with a second row buffer and the third subarray is associated with a third row decoder, wherein the second row buffer and the third row decoder have a common orientation.

11. The apparatus of claim 10, wherein the second row buffer is directly coupled to the third row decoder, wherein the second row buffer is to provide address information to the third row decoder to enable the third row decoder to access the third subarray.

12. The apparatus of claim 1, wherein a latency to read information from the second subarray is less than a latency to read information from the first subarray.

13. A method comprising:

receiving, in a memory, a read request having an address;

accessing a first subarray of the memory using at least a portion of the address, the first subarray having a first orientation, to determine whether the at least portion of the address is a hit in the first subarray; and in response to the hit in the first subarray, precharging a second subarray having a second orientation and reading data from the address in the second subarray.

14. The method of claim 13, further comprising, in response to a miss in the first subarray, sending the read request to a storage without precharging the second subarray.

15. The method of claim 13, further comprising in response to the hit in the first subarray, providing information from a row buffer of the first subarray to a row decoder of the second subarray.

16. The method of claim 13, further comprising:

receiving, in the memory, a matrix multiplication request;

accessing a first operand stored in a third subarray of the memory, the third subarray having the first orientation, the first operand comprising row data of a first matrix;

accessing a second operand stored in a fourth subarray of the memory, the fourth subarray having the second orientation, the second operand comprising column data of a second matrix; and sending the first operand and the second operand to a computation circuit, to cause the computation circuit to perform a matrix multiplication between the first operand and the second operand.

17. The method of claim 16, further comprising sending the first operand and the second operand from at least one memory layer of a memory die to a complementary metal oxide semiconductor (CMOS) layer of the memory die, the CMOS layer comprising the computation circuit.

18. A package comprising:

a first die comprising a central processing unit (CPU); and a second die comprising a memory, wherein the first die is adapted on the second die, the memory comprising:

a first subarray having a first plurality of memory cells, the first subarray having a first orientation and associated with a first row decoder and a first row buffer; and a second subarray having a second plurality of memory cells, the second subarray having a second orientation, the second orientation orthogonal to the first orientation, the second subarray associated with a second row decoder and a second row buffer, wherein the first row buffer is to provide information from the first subarray directly to the second row decoder.

19. The package of claim 18, wherein the first subarray is configured to store a table, wherein in response to a read request having an address, at least a portion of which is a hit in the first subarray, the memory is to precharge the second subarray to effect a read operation for the read request.

20. The package of claim 18, wherein the second die further comprises a complementary metal oxide semiconductor (CMOS) layer comprising a computation circuit, wherein in response to a matrix multiplication request, the computation circuit is to perform a matrix multiplication between:

a first operand obtained from the first subarray, the first operand comprising row data of a first matrix; and a second operand obtained from the second subarray, the second operand comprising column data of a second matrix.

* * * * *